(12) United States Patent
Kirihata et al.

(10) Patent No.: US 6,845,033 B2
(45) Date of Patent: Jan. 18, 2005

(54) STRUCTURE AND SYSTEM-ON-CHIP INTEGRATION OF A TWO-TRANSISTOR AND TWO-CAPACITOR MEMORY CELL FOR TRENCH TECHNOLOGY

(75) Inventors: Toshiaki Kirihata, Poughkeepsie, NY (US); John W. Golz, Manassas, VA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,954

(22) Filed: Mar. 5, 2003

(65) Prior Publication Data

US 2004/0174733 A1 Sep. 9, 2004

(51) Int. Cl.[7] ............................................. G11C 11/24

(52) U.S. Cl. .............. 365/149; 365/189.04; 365/230.05

(58) Field of Search ................................ 365/145, 149, 365/189.04, 230.05

(56) References Cited

U.S. PATENT DOCUMENTS

| | | | | |
|---|---|---|---|---|
| 5,406,510 A | * | 4/1995 | Mihara et al. | 365/145 |
| 6,169,684 B1 | * | 1/2001 | Takahashi et al. | 365/49 |
| 6,552,951 B1 | * | 4/2003 | Raj et al. | 365/230.05 |
| 6,711,050 B2 | * | 3/2004 | Sadakata | 365/149 |

* cited by examiner

*Primary Examiner*—Son Mai
(74) *Attorney, Agent, or Firm*—H. Daniel Schnurmann (57) ABSTRACT

A two-port dynamic random access memory (DRAM) cell consisting of two transistors and two trench capacitors (2T and 2C DRAM cell) connecting two one transistor and one capacitor DRAM cell (1T DRAM cell) is described. The mask data and cross-section of the 2T 2C DRAM and 1T DRAM cells are fully compatible to each other except for the diffusion connection that couples two storage nodes of the two 1T DRAM cells. This allows a one-port memory cell with 1T and 1C DRAM cell and a two-port memory cell with 2T and 2C DRAM cell to be fully integrated, forming a true system-on chip architecture. Alternatively, by halving the capacitor, the random access write cycle time is further reduced, while still maintaining the data retention time. The deep trench process time is also reduced by reducing by one-half the trench depth.

8 Claims, 7 Drawing Sheets

STRUCTURE AND SYSTEM-ON-CHIP INTEGRATION OF A TWO-TRANSISTOR AND TWO-CAPACITOR MEMORY CELL FOR TRENCH TECHNOLOGY

BACKGROUND OF INVENTION

This invention generally relates to embedded dynamic random access memory, and more particularly to a cell structure formed by two transistors and two capacitors to be used in a system on-chip embedded dynamic random access memory (DRAM).

For several decades, one-transistor DRAMs have been the dominant choice for high density and low cost semiconductor memory in computing systems. Recently, advances in miniaturization have allowed integrating a processor on the same chip as the DRAM. Embedding a DRAM on the same chip alongside with the processor not only reduces packaging cost, but it also increases significantly the processor to memory available bandwidth. Because of the smaller memory cell size, embedded DRAMs can be approximately three to six times denser than embedded Static Random Access Memories (eSRAM) operating at lower power dissipation and 1000 times improved soft-error rate.

Figure 1A:
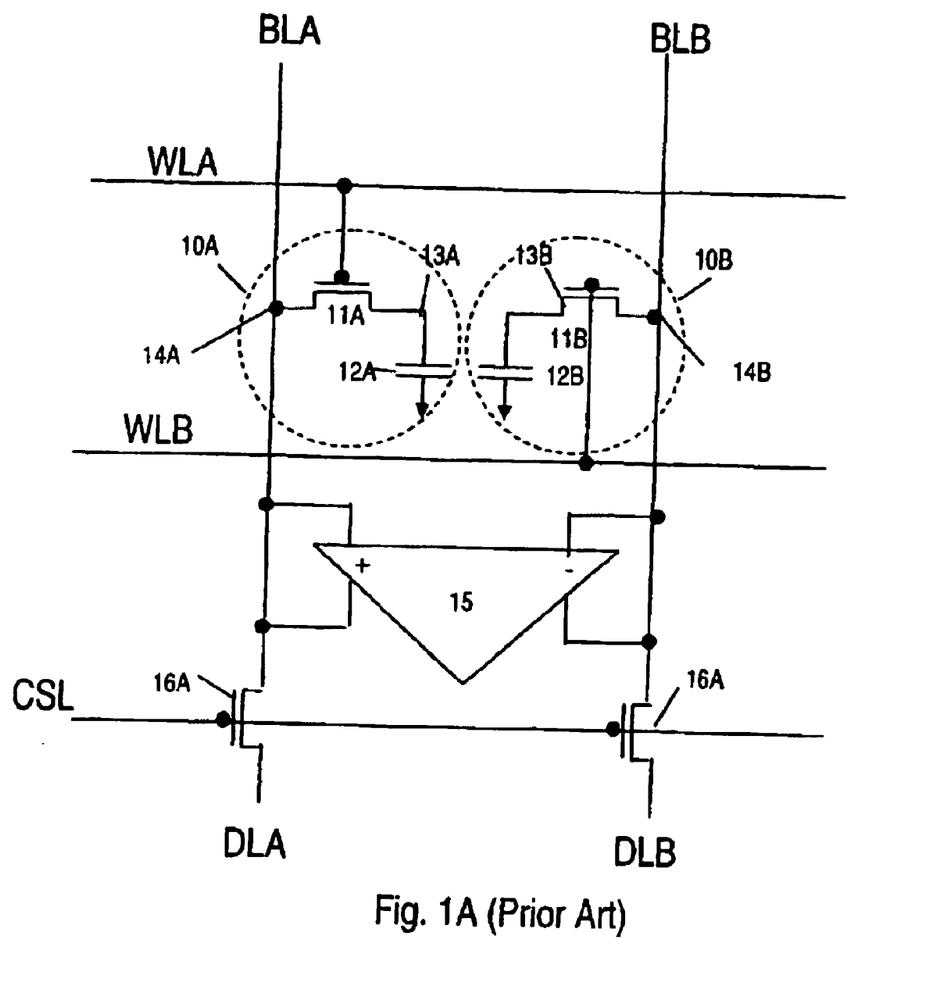
FIGS. 1A–1B are schematic diagrams respectively showing a transistor level representation of a prior art 1T 1C DRAM cell used in commodity DRAM cells and a cross-section thereof.
Figure 1B:
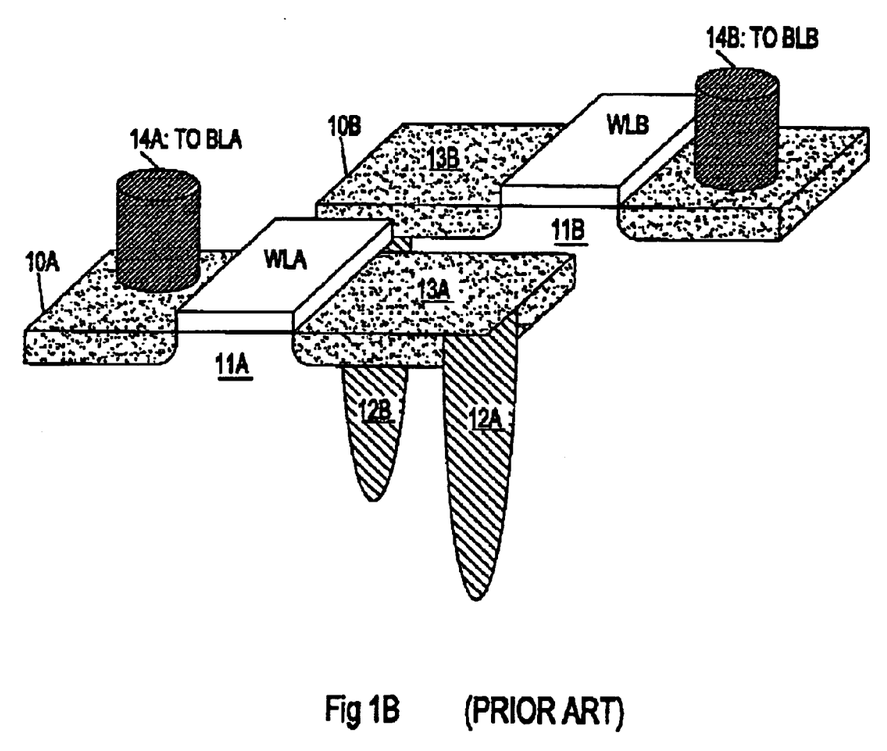

Conventional embedded DRAM cells typically employ for commodity DRAMs a one-transistor and one-capacitor dynamic random access memory cell (1T 1C DRAM). FIGS. 1A and 1B. respectively, show a transistor level schematic and a cross-section thereof. FIG. 1A illustrates two DRAM cells 10A and 10B, each DRAM cell consisting of an NMOS transistor 11A (or 11B) and a capacitor 12A (or 12B). Because of its simplicity, the DRAM cell size is small as one-sixth to one-tenth the size of an SRAM cell having six transistors. The capacitor 12A or 12B makes use of a trench structure coupled to storage node 13A (or 13B), as illustrated in FIG. 1B that shows a perspective view of the same transistor level representation depicted in FIG. 1A Alternatively, a planar or stack capacitor structure may be used as a cell, which is well known in the art, and as such will not be discussed further. When wordline WLA (or WLB) is activated, the NMOS 11A (or 11B) is coupled to capacitor 12A (or 12B) to bitline BLA (or BLB)through bitline contact 14A(or 14B).This creates a small BL voltage due to a charge sharing effect between capacitor 12A (or 12B) and BLA (or BLB). Note that charge sharing destroys the data bit in capacitor 12A (or 12B) (destructive read). The second BL (i.e., BLB) of the pair keeps BL at a pre-charge voltage. and is used as the reference bitline. Bitline sense amplifier 15 is coupled to the BL pair for reading and writing the data bit back to the capacitor. The small BL voltage created on the bitline pair (BLA and BLB) is amplified by the sense amplifier. When the NMOS column switch (16A and 16B) is enabled by column select signal CSL, the sense amplifier will also control the data pair (DLA and DLB). The sense amplifier drives the bitline pair according to the sensing result, allowing to rewrite the read data bit to capacitor 12A (or 12B) (write back). During a write mode operation, the bitline pair BLA and BLB is driven by the data line pair (DLA and DLB) through the NMOS column switches (16A and 16B) to either low and high or, vice versa, to high and low, depending on the data pattern. Typically, a write mode is enabled alter a read operation, because only selected cells are found to be in the write mode while other cell data bits are destroyed when activating wordline WL (also referred to destructive write). The destroyed data bits must be written back by the sense amplifier simultaneously with the write data bits (read modified write). The destructive read followed by a write back, and a read modified write caused by the destructive write require a longer cycle time than the one provided by the SRAM cell. The improved performance of the conventional embedded DRAMs is negligible and is limited by the read modified write operation when it is compared to that of a similar operation in a commodity DRAM. However, because of the inherent high density, they are successfully employed for graphic applications.

In order to enhance their advantage, embedded DRAMs have adopted architectural changes from their stand-alone counterparts in order to improve the bandwidth, latency and memory cycle time. Because the I/O width of the embedded DRAM in an embedded system can be very large, the page mode operation that is commonly used in commodity DRAMs does not improve its performance. Instead, improved random access time (or latency) and cycle time (or address bandwidth) is paramount to boosting the system performance.

Random access performance improvement was first addressed by utilizing a short bitline and wordline array, also referred to as a micro-cell architecture. The micro-cell architecture is discussed in great detail in the article by T. Kimura et al, 64 Mb 6.8 ns random row access DRAM macro for ASICs, published in ISSCC Digest of Technical papers, pp. 420–421, 1999. In order to further improve the random access performance, 2-port memory cells have been proposed and successfully implemented, as will be described hereinafter.

Figure 2:
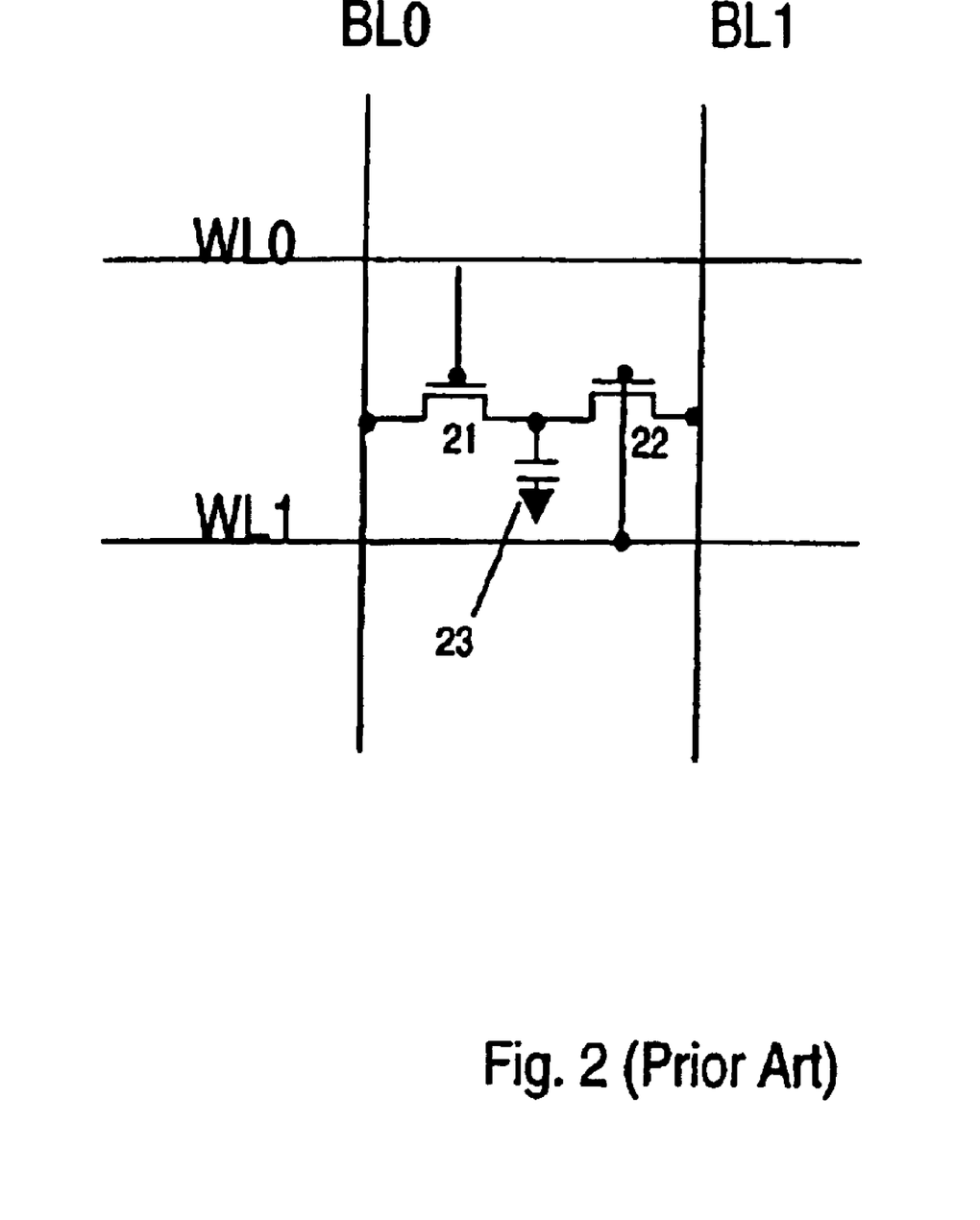
FIG. 2 is a schematic diagram of a conventional transistor level 2-port DRAM cell.

FIG. 2 shows a transistor level schematic for a conventional 2-port dynamic memory cell. It consists of two NMOS switching transistors 21 and 22, and one capacitor 23 (the combination being referred to as 2T 1C cell). The gates of NMOS switching transistors 21 and 22 are coupled to two separated wordlines WL0 and WL1. By activating both WL0 and WL1, the memory cells, respectively coupled to WL0 and to WL1 can be simultaneously read or written through the corresponding bitlines BL0 and BL1. The simultaneous read or write feature of the 2-port memory cell uses the two ports in an interleaving manner, resulting in halving the cycle time. Alternatively, one of the two ports may be used to perform a refresh operation to completely hide the refresh operation. The 2T 1C dual port cell is particularly useful for network applications because of its fast random access cycle time over a 1T 1C DRAM cell. A dual-port function is also an important feature for cache applications. Details of the 2-port memory cell and structure are disclosed in the article by Y. Agata et al., An 8-ns Random Cycle Embedded RAM Macro with Dual-port Interleaved DRAM Architecture, published in the IEEE Journal of Solid States Circuits, vol. 35, No. 11, pp. 1668–1672, November 2000.

System level integration is known to be an important requirement to construct a system on-chip (SOC) with embedded DRAMs. In a true system-on chip design, the graphic memory, network memory and cache memory need to be integrated in the same chip to enable compatibility of the process technology that supports various kinds of memories. It is not known in the art how to enable process compatibility when integrating a 1T 1D cell and 2T and 1T cell on a single chip. The existing 2-port memory cell successfully improves the random access performance. However, the 2-port memory cell creates an incompatibility with existing 1T and 1C memory cells, resulting in limiting the use of the 2-port memory cell to only the system and without using a 1T and 1C memory cell.

SUMMARY OF INVENTION

Accordingly, it is an object of the present invention to integrate a 2-port memory cell and 1-port memory cell in the same chip to achieve a true system on-chip.

It is another object of the present invention to enable a 2-port memory cell compatible to the 1-port memory cell structure.

It is a further object of the present invention to configure a 2-port memory cell structure by connecting the diffusion of two 1T 1C DRAM cell structures.

It is still another object of the present invention to improve the random access cycle time with a 2-transistor and 2-capacitor (2T and 2C) DRAM cell.

It is a more particular object of the present invention to implement the 2T 2C DRAM cell in trench technology applications.

According to one aspect of the invention, there is provided a 2-port memory cell structure having two transistors and two trench capacitors coupled to a common storage node. The two transistors are independently controlled by utilizing the first and second wordlines to access a data bit in the common storage node through either one of the two transistors to the corresponding bitlines. The 2-port memory cell is structured to utilize 1-port memory cells, each having one transistor and one capacitor, while connecting the two storage nodes to a common storage node. This allows the 2-port memory cell to become fully compatible with the 1-port memory cell, thereby allowing the integration of the 2-port memory cell and the 1-port memory cell on the same chip. Alternatively, the trench depth of the 2-port memory cell can be halved when integrating it with the 1-port memory cell is not required. This allows reducing the write mode performance because of the two parallel paths to the capacitor without reducing the storage charge.

Optionally, the trench depth can be made the same as the one used for the 1-port memory cell even when integration with the 1-port memory cell is not necessary. This enables to increase the storage charge as much twice that of the 1-port memory cell, resulting in a longer retention and a lower voltage operation.

The memory cell structure and mask data that configure a 2-port memory cell are fully applicable for trench technology applications.

In a second aspect of the invention, there is provided a memory cell that includes two transistors and two trench capacitors, wherein one of the two transistors is controlled by a first wordline that selectively couples a storage node of the two trench capacitors to a first bitline, and the other of the two transistors is controlled by a second wordline that selectively couples the storage node to a second bitline.

In a third aspect of the invention, there is provided a system on-chip that includes a first memory cell formed by a 1-port memory cell consisting of one transistor and one trench capacitor, wherein the one transistor is controlled by a wordline that selectively couples a storage node of the trench capacitor to a bitline; and a 2-port memory cell consisting of two memory cells, each having one transistor and one trench capacitor to selectively couple a storage node of the trench capacitor to a bitline, wherein two storage nodes of the two memory cells are linked to each other to form a common storage node, allowing access of a data bit in the common storage node of the trench capacitors through the one transistor of either one of the two 1-port memory cells.

In a fourth aspect of the invention, there is provided a system-on chip that includes a first 1-port memory cell and a 2-port memory cell, the first 1-port memory cell consisting of a first transistor and first trench capacitor to selectively access a storage node of the first trench capacitor to a bitline through the first transistor that controls a wordline, and the 2-port memory cell consisting of two second 1-port memory cells, each having a second transistor and a second trench capacitor that selectively couple a storage node of the second trench capacitor to a bitline, the two storage nodes of the two memory cells being connected to each other to form a common storage node, allowing access of a data bit in the common storage node through the second transistor of either one of the second transistor of the two second 1-port memory cells, wherein the first and second 1-port memory cell of the 2-port memory cell have the same structure.

BRIEF DESCRIPTION OF DRAWINGS

These and other objects, aspects and advantages of the invention will become apparent from the following detailed description of preferred embodiments of the invention, when taken in conjunction with the accompanying drawings.

DETAILED DESCRIPTION

Figure 3A:
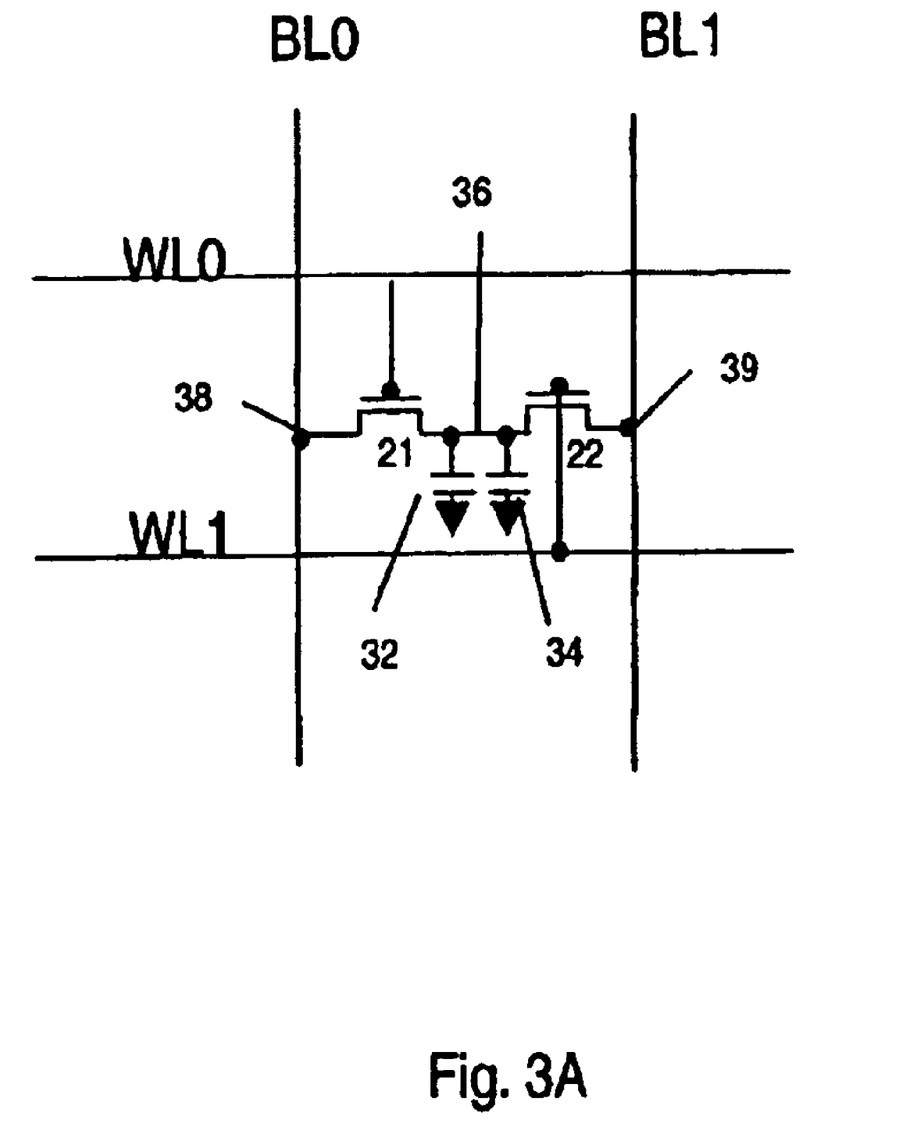
FIGS. 3A–3B show a transistor level schematic diagram and a cross-section thereof of the 2-port memory cell when applied to the trench technology, in accordance with a first embodiment of the invention.
Figure 3B:
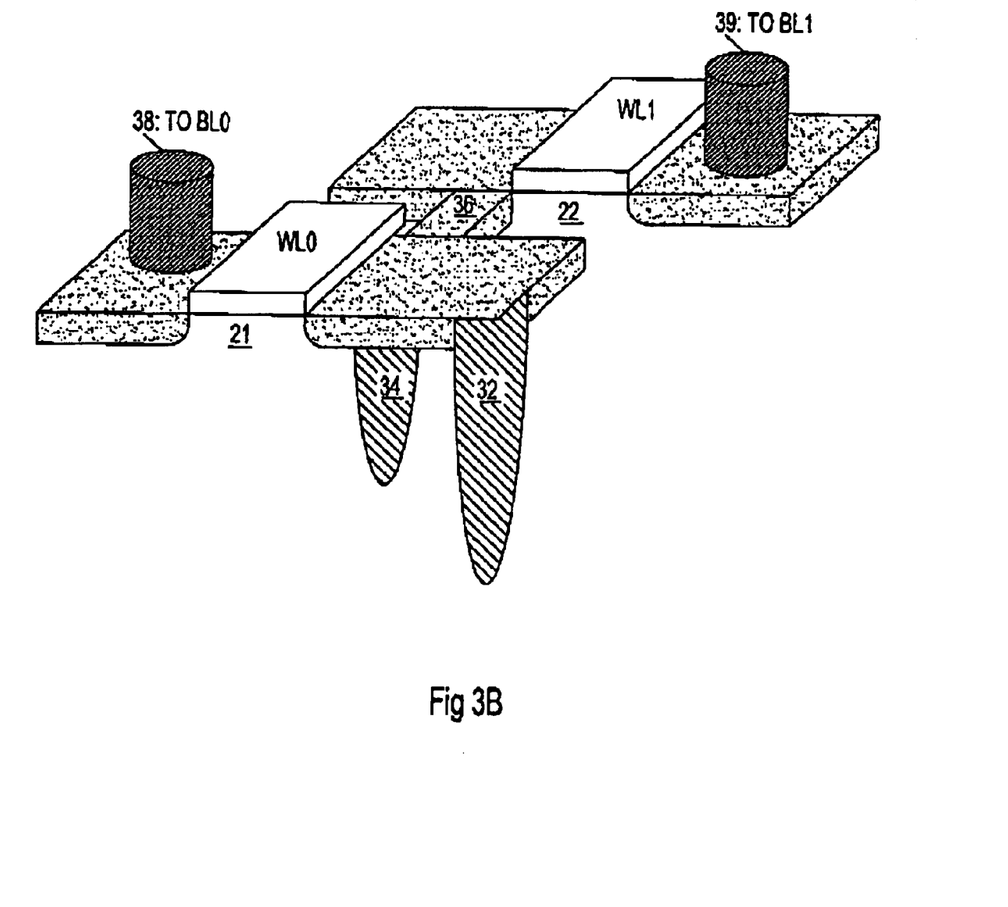

FIGS. 3A and 3B show respectively a transistor level schematic and a cross-section of the inventive 2-port memory cell when applied to trench technology.

Referring to FIG. 3A, there is shown a two-port memory cell consisting of two NMOS access transistors 21 and 22 coupled to a corresponding wordline (WL0 for port 0 and WL1 for port1) and corresponding bitline (BL0 for post 0 and BL1 for port1). Unlike a conventional 2-port memory cell having one capacitor (see FIG. 2), the 2-port memory coil includes two capacitors 32 and 34. By utilizing two transistors and two capacitors to form the cell, the structure of the inventive 2T 2C cell shown in FIG. 3A can achieve full compatibility with the 1T 1C DRAM cell shown in FIG. 1. This is achieved by coupling storage node 36 of the two 1T 1C cells by way of a diffusion connection 36, as shown in FIG. 3B, while keeping the two trench structure of the 1T 1C cell shown in FIGS. 1A and 1B. Storage node 36 can be accessed by either port 0 or post 1, using for this purpose, either WL0 and BL0 (or WL1 and BL1). Bitlines BL0 and BL1 shown in FIG. 3B remain connected to bitline contacts 38 and 39. The present example illustrates capacitors 32 and 34 being configured for a trench structure. It is an essential aspect of the invention that the structure of the trench capacitor be such that the depth and width remain fully compatible with the 1T DRAM cell. Practitioners in the art will fully realize that other capacitor structures, such as a planar or a stack capacitor may be used advantageously, while still keeping the same capacitor structure between the 1T 1C and the 2T 2C cells. This allows the 2T 2C cell and the 1T 1C cell to be fully integrated on the same chip using the same process technology. The trench depth is set to be "shallower" than the depth of any other trench capacitor integrated within the chip, since the actual capacitance coupling to storage node 36 is twice as large than that using the single trench capacitor coupled to the storage node 36. The trench capacitance is commonly used for decoupling capacitors, or for a conventional one transistor and one capacitor memory cell as discussed in the Background of Invention. Alternatively, even if the trench depth is halved, one my still obtain the same capacitance as that of a 1T DRAM cell even when the sole purpose of using a 2T 2C cell is limited to system integration (i.e., system on-chip). The stated integration results in reducing the write cycle time while maintaining the data retention time, a significant advantage if the trench strap resistance is large. It further allows the 2T 2C memory cells to improve the random access cycle time. Optionally, the capacitor may be constructed to the same depth as that of the 1T DRAM cell, allowing the node capacitor to be twice as long as that of the 1T DRAM cell to achieve a long retention time or a low voltage operation, and still retain fully compatibility with the 1T 1C DRAM cell technology.

Figure 4:
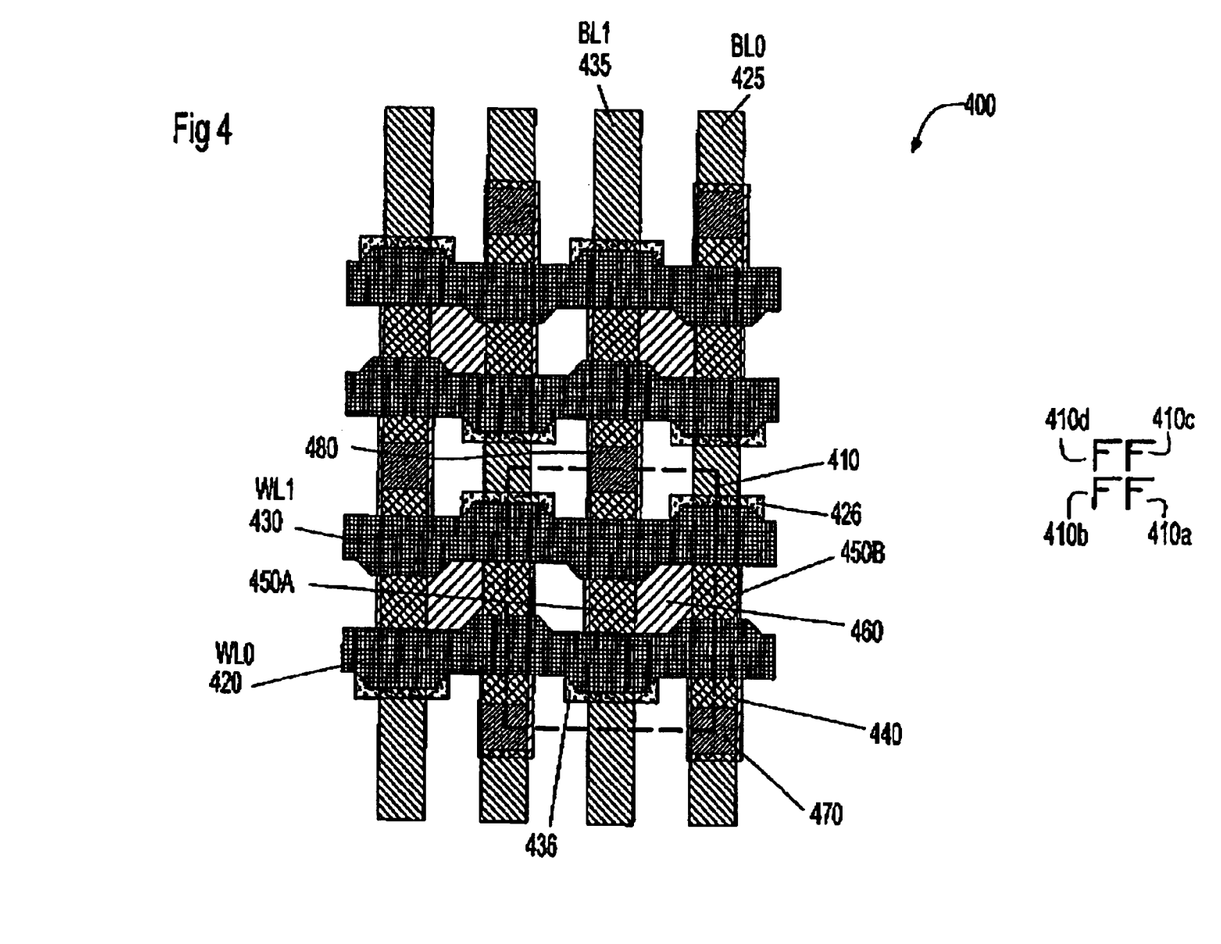
FIG. 4 illustrates a layout of a 2T 2C memory cell base unit consisting of four identical memory cells (F) arranged in a 2 by 2 matrix formation, according to the present invention.

FIG. 4 shows a 2T 2C memory cell base unit 400. Unit 400 consists of four 2T 2C memory cells 410 arranged in a 2 by 2 matrix (i.e., 410a, 410b, 410c, and 410d), wherein F shows the direction of the unit arrangement. The transistor level schematic and cross-section of the 2T 2C memory cells 410 is the same as that shown in FIGS. 3A–3B. Wordline WL0 for port 0 and wordline WL1 for port 1 use a continuous contact of polysilicon in the x-direction. Wordlines WL0 420 and WL1 430 are preferably stitched with second level metal (M2) in the stitched area (not shown). Bitline BL0 425 for port 0 and bitline BL1 435 for port 1 use a continuous first level metal (M1) spanning in the y-direction. A diffusion mask layer 450A for port 0 is positioned perpendicular to the WL0 in every other column. The combination of the previously described polysilicon for WL0 420 and diffusion connection 450A form an access gate transistor 21 (FIG. 3B) on every other column. The source of access transistor 21 is coupled to the corresponding BL0 425 for port 0 through first level metal M1 contact 470. The drain of the access transistor is coupled to trench capacitor 426. The diffusion mask layer 450B for port 1 is placed in a direction perpendicular to WL1 in the other alternating column. This creates a second access gate transistor 22 (FIG. 3B) on the previously mentioned alternate columns. The source of access transistor 22 is coupled to the corresponding BL1 435 for port 1 through M1 contact 480. The drain of access transistor 22 is coupled to trench capacitor 436. These configurations are similar to the 1T dynamic memory cell shown in FIG. 1. Unlike the 1T DRAM cell, the drain of the access transistors 21 that is coupled to trench capacitor 32 and access transistor 22 coupled to trench capacitor 34 are connected by way of diffusion connection 460. This allows the two trench capacitors 32 and 34 (FIG. 3B) to be accessed by either access transistor 21 or 22.

Figure 5:
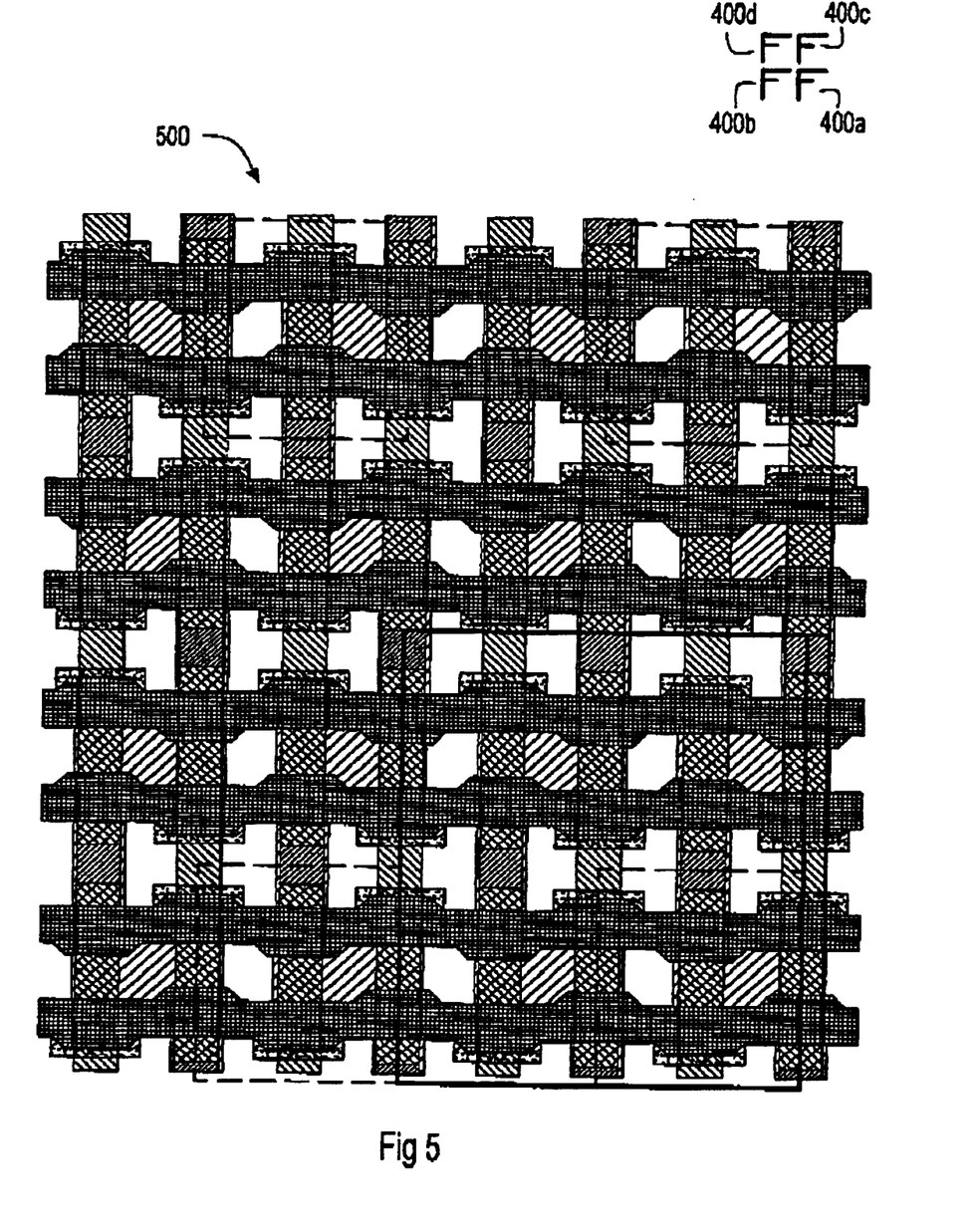
FIG. 5 shows a layout of a 16-bit array formed by a plurality of 2T 2C memory units arranged in a matrix formation.

Referring to FIG. 5, there is shown an array 500 formed by a plurality of 2T 2C units 400 arranged in a matrix. For illustrative purposes, a 2 by 2 matrix of 2T 2C units (i.e., 400a, 400b, 400c, and 400d) is depicted, each consisting of 2 by 2 cells (i.e., 410a, 410b, 410c, and 410d), which are shown at the bottom right of FIG. 5, wherein F illustrates the direction of the arrangement. This results in a 16 bit-array organization. However, this invention is not limited to only this array arrangement. By adding more units 400 in the x or y, or in the x and y direction, arrays of any dimension can be configured.

While the invention has been described in terms of several preferred embodiments, various changes and modifications can be incorporated by those skilled in the art without departing from the scope and spirit of the invention. Accordingly, the present invention is intended to embrace all such alternatives which fall within the scope of the appended claims.

What is claimed is:

1. A memory cell integrated in a chip comprising:

two transistors and two trench capacitors, wherein one of said two transistors is controlled by a first wordline that selectively couples a storage of said two trench capacitors to a first bitline, and the other of said two transistors is controlled by a second wordline that selectively couples said storage node to a second bitline, and wherein the depth of said two trench capacitors is shallower than the depth of other trench capacitors integrated in said chip.

2. The memory cell as recited in claim 1 further comprising a 2-port memory cell, for gaining access of a data bit in said storage node through said first bitline when controlling said first wordline, or through said second bitline when controlling said second wordline.

3. The memory cell as recited in claim 2 further comprising a first and second memory cells, each having one transistor and one trench capacitor, wherein said transistor in said first memory cell is controlled by said first wordline, selectively coupling a first storage node of said first trench capacitor to said first bitline, and wherein said transistor in the second memory cell is controlled by said second wordline, selectively coupling a second storage node of said second trench capacitor to said second bitline, linking said first and second storage nodes to form a common storage node.

4. The memory cell as recited in claim 3 wherein said memory cell is integrated in a system-on chip by integrating said first memory cell or said second memory cell as a 1-port memory cell.

5. The memory cell as recited in claim 4, wherein said 1-port memory cell is formed by not linking said first and second storage nodes in order to form another two storage node for two of said 1-port memory cells.

6. The memory cell as recited in claim 4 wherein said first and second memory cells have an identical structure.

7. The memory cell as recited in claim 1, wherein the depth of said trench is one-half the depth of one transistor and one capacitor memory cell forming a 1-port memory cell, thereby reducing the write time constant to a value that is not greater than one-half that of said 1-port memory cell.

8. The memory cell as recited in claim 1, wherein the depth of said trench is the same as the depth of said one transistor and one capacitor memory cell configured as a 1-port memory cell, generating a storage charge which is twice the charge of a 1-port memory cell.

* * * * *